United States Patent
Tilke et al.

(10) Patent No.: US 8,319,285 B2
(45) Date of Patent: Nov. 27, 2012

(54) SILICON-ON-INSULATOR CHIP HAVING MULTIPLE CRYSTAL ORIENTATIONS

(75) Inventors: Armin Tilke, Hopewell Junction, NY (US); Jiang Yan, Newburgh, NY (US); Matthias Hierlemann, Hopewell Junction, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/315,069

(22) Filed: Dec. 22, 2005

(65) Prior Publication Data
US 2007/0145481 A1    Jun. 28, 2007

(51) Int. Cl.
*H01L 29/04* (2006.01)
(52) U.S. Cl. ........ 257/351; 257/255; 257/369; 257/627; 257/E29.004
(58) Field of Classification Search .......... 257/255, 257/351, 369, 627, E29.004
See application file for complete search history.

(56) References Cited

U.S. PATENT DOCUMENTS

| | | | |
|---|---|---|---|
| 6,657,276 B1* | 12/2003 | Karlsson et al. | 257/510 |
| 6,815,278 B1 | 11/2004 | Leong et al. | |
| 6,830,962 B1* | 12/2004 | Guarini et al. | 438/149 |
| 7,262,087 B2* | 8/2007 | Chidambarrao et al. | 438/164 |
| 7,393,733 B2* | 7/2008 | Currie | 438/164 |
| 2004/0195646 A1 | 10/2004 | Yeo et al. | |
| 2004/0256700 A1* | 12/2004 | Doris et al. | 257/627 |
| 2005/0116290 A1 | 6/2005 | de Souza et al. | |
| 2005/0124146 A1 | 6/2005 | Bedell et al. | |
| 2005/0130387 A1 | 6/2005 | Hakey et al. | |
| 2005/0277260 A1 | 12/2005 | Cohen et al. | |
| 2006/0003554 A1* | 1/2006 | Zhu et al. | 438/479 |

OTHER PUBLICATIONS

Tomohisa Mizuno et al., "(110)-Surface Strained-SOI CMOS Devices", IEEE Transactions on Electron Devices, vol. 52, No. 3, pp. 367-374, Mar. 2005.
Wei Zhao et al., "Partially Depleted SOI MOSFETs Under Uniaxial Tensile Strain", IEEE Transactions on Electron Devices, vol. 51, No. 3, pp. 317-323, Mar. 2004.
English language Translation—Abstract for: Ulrich Hilleringmann, Silizium-Halbleitertechnologie; 4., durchgesehene und erganzte Auflage Mit 165 Abbildungen, 19 Tabellen und 39 Ubungsaufgaben; B.G. Teubner Stuttgart Leipzig Wiesbaden, Aug. 31, 2004.
Yang, et al. High Performance CMOS Fabricated on Hybrid Substrate with Different Crystal Orientations. In: Electron Devices Meeting, 2003. IEDM 2003, Technical Digest. IEEE Intern., IEDM 2003, 2003, 18.7.1.

* cited by examiner

*Primary Examiner* — Marcos D. Pizarro
(74) *Attorney, Agent, or Firm* — Dicke, Billig & Czaja, PLLC (57) ABSTRACT

A silicon-on-insulator device having multiple crystal orientations is disclosed. In one embodiment, the silicon-on-insulator device includes a substrate layer, an insulating layer disposed on the substrate layer, a first silicon layer, and a strained silicon layer. The first silicon layer has a first crystal orientation and is disposed on a portion of the insulating layer, and the strained silicon layer is disposed on another portion of the insulating layer and has a crystal orientation different from the first crystal orientation.

15 Claims, 7 Drawing Sheets

SILICON-ON-INSULATOR CHIP HAVING MULTIPLE CRYSTAL ORIENTATIONS

BACKGROUND

Complementary metal oxide semiconductor (CMOS) technology is the prevalent technology employed for manufacturing ultra large-scale integrated (ULSI) circuits. In general, the CMOS technology desirably employs silicon wafers having a crystal orientation of (100). This crystal orientation is selected for its low surface state density and high electron mobility in the (100) plane. In this regard, an n-channel transistor formed on a silicon substrate with a crystal orientation of (100) provides a large and desirable source-to-drain current.

In contrast, silicon substrates having a crystal orientation of (110) are known to maximize hole mobility in chip transistors. Thus, although crystal orientations (100) optimize electron mobility, this optimized bulk crystalline (100) behavior correspondingly limits hole mobility for transistors on the chip, ultimately sacrificing an overall dynamic performance of the CMOS chips.

In sub-250 nm CMOS technologies, the use of silicon-on-insulator (SOI) substrates is desirable in order to obtain low junction capacitances and high device speed. However, current CMOS technologies employing (100) orientation silicon-on-insulator wafers can limit the overall dynamic performance of the device, as described above. Therefore, a need exists to optimize the performance of nFET and pFET transistors on SOI-based chips.

For these and other reasons, there is a need for the present invention.

SUMMARY

One aspect of the present invention provides a silicon-on-insulator (SOI) device having multiple crystal orientations. The SOI device includes a substrate layer, an insulating layer disposed on the substrate layer, a first semiconductor layer, and a strained silicon layer. In this regard, the first semiconductor layer has a first crystal orientation and is disposed on a portion of the insulating layer, and the strained silicon layer is disposed on another portion of the insulating layer and has a crystal orientation different from the first crystal orientation.

BRIEF DESCRIPTION OF THE DRAWINGS

The accompanying drawings are included to provide a further understanding of the present invention and are incorporated in and comprise a part of this specification. The drawings illustrate embodiments of the present invention and together with the description describe principles of the present invention. Other embodiments of the present invention, and many of the intended advantages of the present invention, will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in different orientations, the directional terminology is used for purposes of illustration only and is in no way intended to be limiting. It is to be understood that other embodiments may be utilized and structural or logical changes may be made, without departing from the scope of the present invention. The following detailed description, therefore, is not to be taken in a limiting sense, and the scope of the present invention is defined by the appended claims.

The present invention generally relates to semiconductor devices, and more particularly, to silicon-on-insulator semiconductor chips having multiple crystal orientations and including at least one strained layer configured to enhance the performance of n-channel and p-channel transistors formed on the chip. The strained layer can be either a strained or stressed layer. The strained layer enhances electron and/or hole mobility in the semiconductor device. A compressive strain in the strained layer enhances electron mobility. A tensile strain in the strained layer enhances hole mobility.

Figure 1:
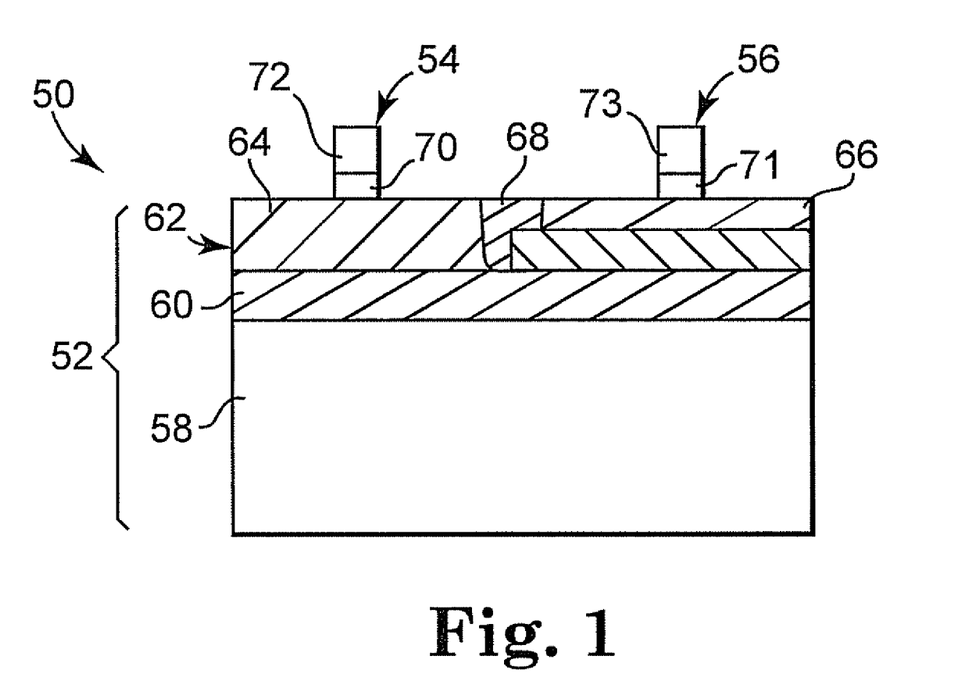
FIG. 1 illustrates a cross-sectional view of a strained silicon-on-insulator chip according to one embodiment of the present invention.

FIG. 1 illustrates a silicon-on-insulator chip 50 including a strained layer 66 according to one embodiment of the present invention. The strained SOI chip 50 includes a strained silicon-on-insulator device 52, a first chip component 54, and a second chip component 56.

The strained silicon-on-insulator device 52 includes a substrate layer 58, an insulating layer 60 disposed on substrate layer 58, and a silicon stratum 62 disposed on insulating layer 60. In one embodiment, silicon stratum 62 optionally includes a strained silicon region 64 isolated and distinct from a strained silicon region 66, where strained silicon region 64 and strained silicon region 66 are co-planar, and parallel to and offset from, insulating layer 60.

Additionally, in one embodiment a trench 68 is formed to electrically isolate strained silicon region 64 from silicon region 66. In one embodiment, trench 68 is a shallow trench isolator etched between strained silicon regions 64 and silicon region 66 and filled with an insulating material, for example, silicon dioxide.

Substrate layer 58 is made of one or more suitable semiconductor materials. For example, substrate layer 58 can be made of Si, SiC, SiGe, SiGeC, Ge, GaAs, InAs, InP or other III/V or II/VI compound semiconductors. In another embodiment, the substrate layer 58 is a silicon-on-insulator substrate or, alternately, a SiGe-on-insulator substrate.

Insulating layer 60 includes an insulator preferably resistant to Ge diffusion. Examples of such insulating and Ge-diffusion resistant materials include crystalline or non-crystalline oxides and/or nitrides. In one embodiment, insulating layer 60 is a buried oxide (BOX) insulating layer.

In one embodiment, first chip component 54 is disposed on strained silicon region 64, and second chip component 56 is disposed on silicon region 66. First and second chip components 54, 56 include a suitable chip component accessing silicon region 64, 66, respectively, of strained silicon-on-insulator device 52. For example, in one embodiment first and second chip components 54 and 56 are transistors, in another embodiment first and second chip components 54, 56 are capacitors, and in yet another embodiment first and second chip components 54, 56 are fusible links.

In one exemplary embodiment, first and second chip components 54, 56 are transistors formed by depositing gate dielectric layers and gate conductor layers that are patterned to form gate dielectrics 70, 71 and respective gates 72, 73. In one embodiment, chip component 54 is an n-channel transistor disposed on silicon region 62, where n-channel transistor 54 defines a gate dielectric 70 in contact with strained silicon region 64 and a gate 72 in contact with gate dielectric 70, and chip component 56 is p-channel transistor disposed on strained silicon region 66, where p-channel transistor 56 defines a separate gate dielectric 71 in contact with silicon region 66 and a separate gate 73 in contact with separate gate dielectric 71. Source and drain regions (not illustrated) can be formed using a variety of implantation processes known to have utility to those of skill in the semiconductor art. In one embodiment gate 72 includes a gate spacer having lightly doped source and/or drain portions.

FIGS. 2-12 illustrate cross-sectional views of strained silicon-on-insulator chip 50 (FIG. 1) at various stages of fabrication. The fabrication process for embodiments of strained SOI chip 50 incorporates a variety of processes conducted in a variety of process routines. Consequently, to simplify the following description, the process will be described for the embodiment illustrated in FIG. 1, but one skilled in the art will understand how other alternate embodiments may be similarly fabricated. In addition, although formation of two chip components 54, 56 is illustrated in the Figures, one skilled in the art will recognize that a typical fabrication process will involve fabrication of multiple chips having multiple chip components.

Figure 2:
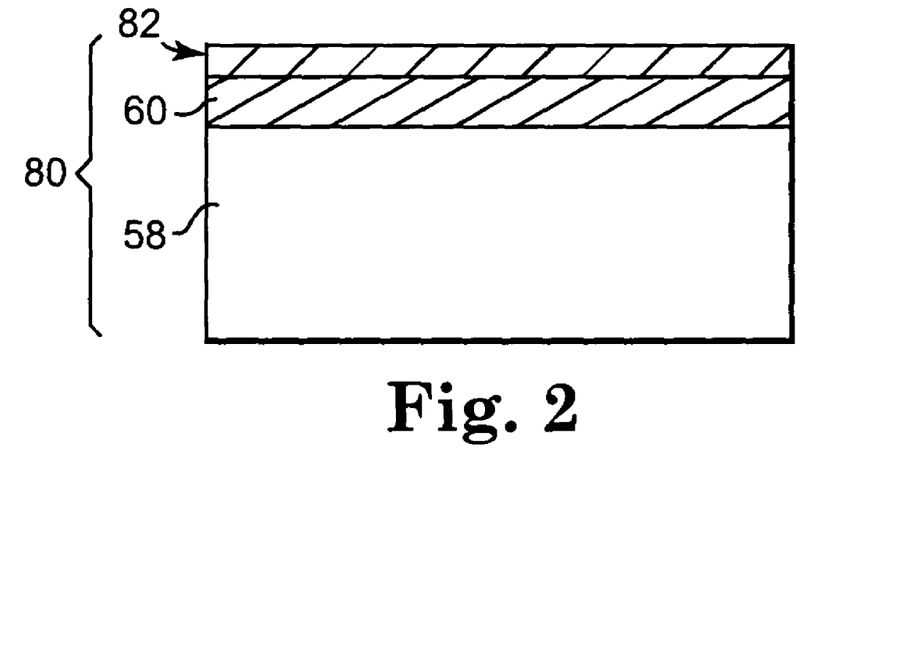
FIG. 2 illustrates a silicon-on-insulator wafer according to one embodiment of the present invention.

FIG. 2 illustrates a silicon-on-insulator wafer 80 according to one embodiment of the present invention. SOI wafer 80 includes substrate layer 58, an insulating layer 60 disposed on substrate layer 58, and a layer 82 disposed on insulating layer 60. With reference to FIG. 1, substrate layer 58 and insulating layer 60 are as described above.

In one embodiment, layer 82 is formed of material configured to define a lattice mismatched relative to a silicon lattice, for example in one embodiment layer 82 is germanium.

In another embodiment, layer 82 is silicon. Silicon layer 82 is bonded to insulating layer 60. In general, silicon layer 82 is made of one or more suitable semiconductor materials including, for example, Si, SiC, SiGe, SiGeC, Ge, GaAs, InAs, InP or other III/V or II/VI compound semiconductors. In one exemplary embodiment, silicon layer 82 is a crystalline Si-containing semiconductor material deposited to have a thickness ranging from approximately 200 Angstroms to approximately 2000 Angstroms. For example, in one embodiment silicon layer 82 defines a crystal orientation (100). In an alternate embodiment, silicon layer 82 defines crystal orientation (110). In general terms, silicon layer 82 can define crystal orientation such as (100), (110), (023), (311), (511), (111), or other crystal orientation given by (h, k, l) where h, k, and l are integers. However, in a preferred embodiment, silicon layer 82 defines one of the crystal orientation (100) or (110) and is bonded to the insulating layer 60.

Figure 3:
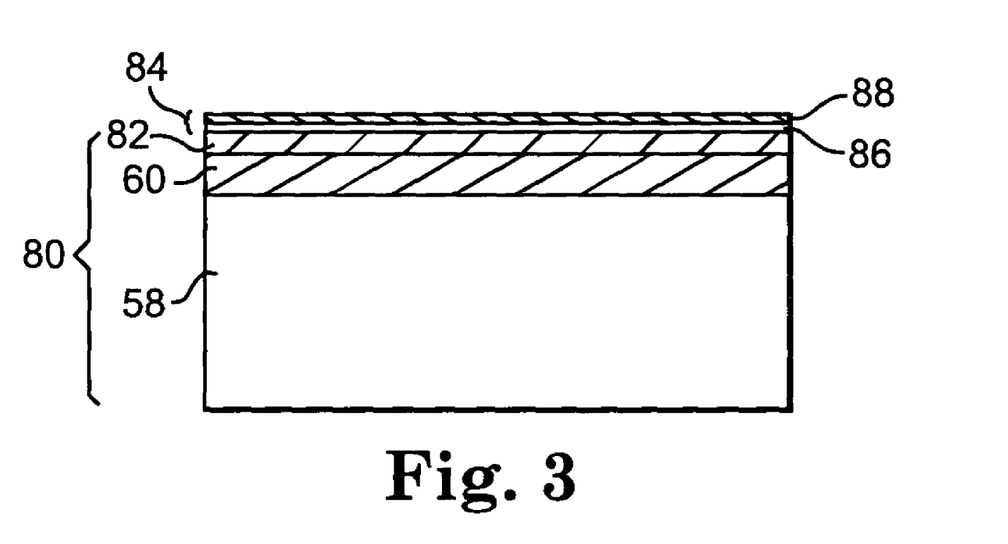
FIG. 3 illustrates a padstack disposed on the SOI wafer illustrated in FIG. 2.

FIG. 3 illustrates a cross-sectional view of SOI wafer 80 including a padstack 84 according to one embodiment of the present invention. Padstack 84 includes in one embodiment a thin oxide layer 86 thermally grown or deposited onto silicon layer 82, and a silicon nitride layer 88 is deposited onto oxide layer 86. In this regard, padstack 84 includes a pad nitride on pad oxide and is deposited as two thin layers. In one embodiment, padstack 84 is planarized in a chemical mechanical planarization (CMP) process and has a substantially planar cross-section as illustrated.

Figure 4:
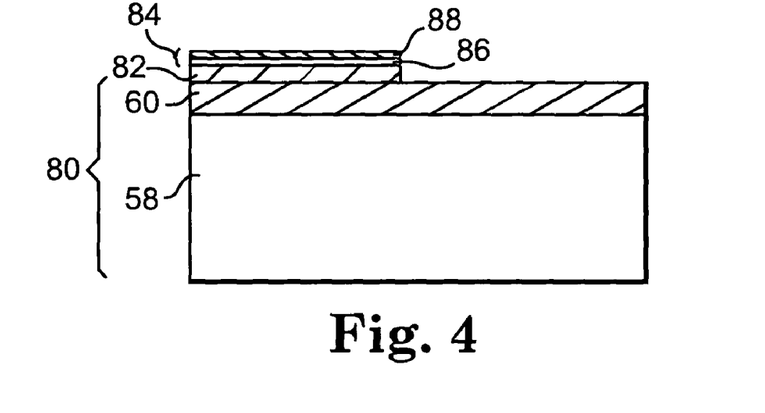
FIG. 4 illustrates the SOI wafer illustrated in FIG. 3 after a subsequent etch and strip process.

FIG. 4 illustrates a cross-sectional view of SOI wafer 80 and padstack 84 after a reactive ion etch (RIE) and resist strip process according to one embodiment of the present invention. A portion of silicon layer 82 and a portion of padstack 84 is photoresist coated. An etch process (wet or dry) is employed to remove the nitride, the oxide and the part of the silicon layer 82 where the photoresist pattern is absent. As illustrated in the cross-sectional view, approximately half of silicon layer 82 and approximately half of padstack 84 has been etched away by the RIE process. The RIE process could remove a larger or smaller portion of silicon layer 82 and padstack 84.

Figure 5:
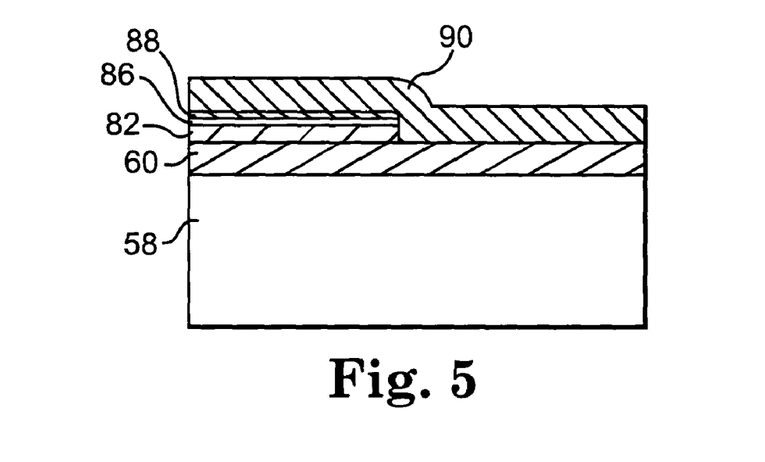
FIG. 5 illustrates deposition of a filloxide layer onto portions of an SOI wafer according to one embodiment of the present invention.
Figure 7:
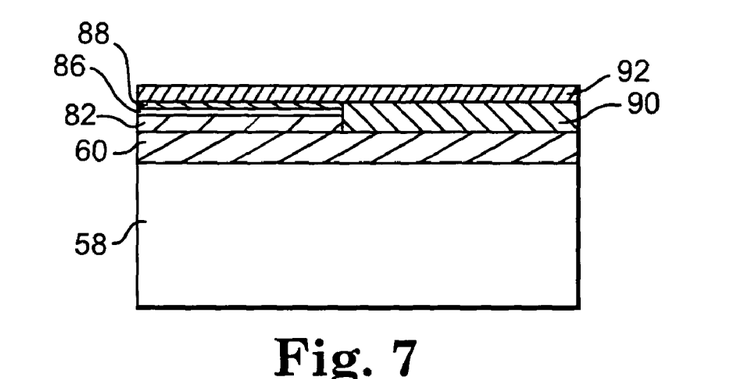
FIG. 7 illustrates a silicon layer disposed on the planarized wafer illustrated in FIG. 6.

FIG. 5 illustrates a cross-sectional view of the partially processed wafer illustrated in FIG. 4 including a planarization dielectric 90 according to one embodiment of the present invention. In one embodiment, planarization dielectric 90 is a single layer filloxide. In another embodiment, planarization dielectric 90 is a filloxide including multiple layers. The filloxide can be either a stressed oxide or stressed nitride or contain one or more stress-generating layers. For example, in one embodiment, filloxide 90 includes a high stress silicon nitride film thermally processed to induce a strain in silicon layer 82 and to subsequently induce a strain in layer 92 (FIG. 7). In this manner, silicon layer 82 has been processed into a strained silicon layer by lateral stress transfer from filloxide layer 90 and has a crystal orientation of (100).

Figure 6:
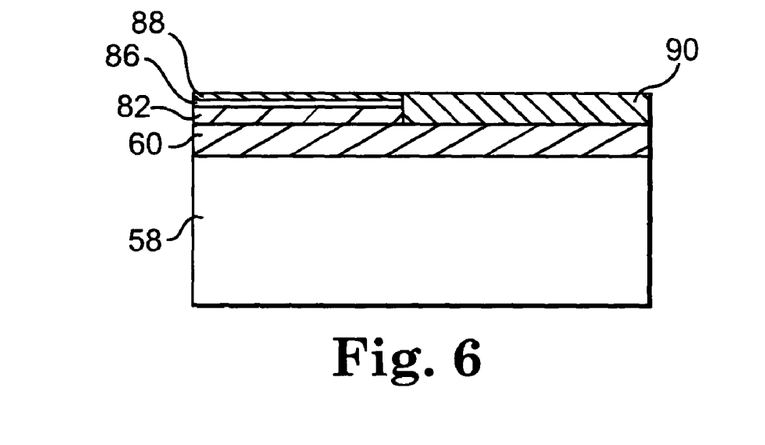
FIG. 6 illustrates a semiconductor layer adjacent to a filloxide layer after a planarization process according to one embodiment of the present invention.

FIG. 6 illustrates the partially processed wafer illustrated in FIG. 5 after a planarization process. In one embodiment, the planarization process is a CMP process employed to planarize filloxide layer 90 level with silicon nitride layer 88.

FIG. 7 illustrates a cross-sectional view of a silicon layer 92 disposed on the partially processed wafer illustrated in FIG. 6. Stress transfer from underlying filloxide layer 90 stresses silicon layer 92. Silicon layer 92 is formed to have a different, but complimentary, crystal orientation comparatively to silicon layer 82. In this regard, where layer 82 is a silicon layer having a crystal orientation of (100), then second silicon layer 92 is formed to have a crystal orientation of (110). In a similar and complimentary manner, if silicon layer 82 is formed to have a crystal orientation of (110), then second silicon layer 92 is formed to have a crystal orientation of (100). The following description refers to silicon layer 82 as including a crystal orientation of (100) and second silicon layer 92 as including a crystal orientation of (110), although the vice versa order is also acceptable, as are other (h, k, l) crystal orientations.

Second silicon layer 92 is formed of substantially the same materials as first silicon layer 82 and includes, for example, Si, SiC, SiGe, SiGeC, Ge, GaAs, InAs, InP or other III/V or II/VI compound semiconductors. In one embodiment, second silicon layer 92 is deposited onto planar silicon nitride layer 88 and filloxide layer 90 and is strained by the filloxide layer 90 to define a strained silicon layer.

Trench 68 illustrated in FIG. 1 could be formed immediately subsequent to the processing illustrated in FIG. 7 to isolate silicon layer 82 from filloxide 90 and from second silicon layer 92. In one embodiment, trench 68 could be formed as a shallow trench between silicon layer 82 and second silicon layer 92, as more fully described below.

Figure 8:
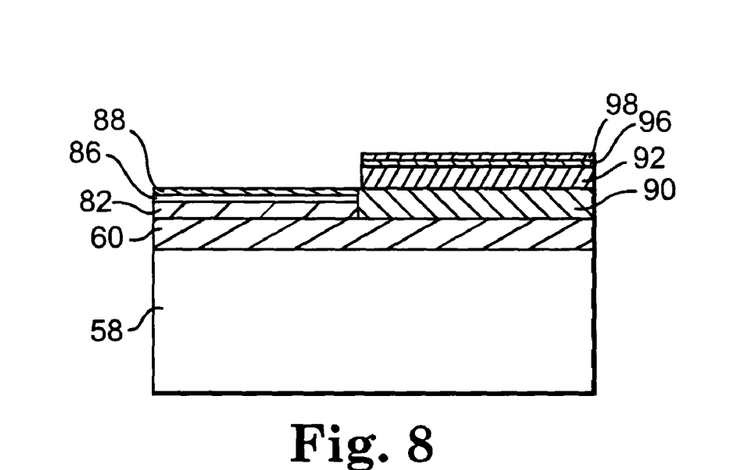
FIG. 8 illustrates a subsequent mask, etch and strip process of the wafer illustrated in FIG. 7.

FIG. 8 illustrates a cross-sectional view of the partially processed wafer illustrated in FIG. 7 after a partial etch and resist strip process according to one embodiment of the present invention. After an exemplary a reactive ion etch (RIE) process, a thin oxide layer 96 and a silicon nitride layer 98 remain disposed atop second silicon layer 92. The etch process can be, for example, a wet chemistry etch, or alternately, a plasma gas excited dry etch. In one embodiment, thin oxide layer 96 and silicon nitride layer 98 are analogous and highly similar to thin oxide layer 86 and silicon nitride layer 88 of padstack 84 (FIG. 3), and are referred to as pad oxide 96 and pad nitride 98 layers, respectively.

Figure 9:
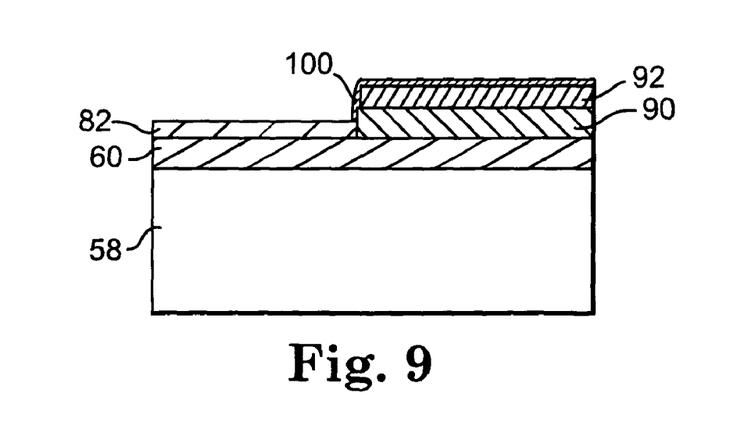
FIG. 9 illustrates a nitride spacer disposed on the wafer illustrated in FIG. 8.

FIG. 9 illustrates a cross-sectional view of the wafer stack illustrated in FIG. 8 after pad oxide 96 and pad nitride 98 have been stripped by a strip process. The exposed pad oxides and pad nitrides are removed to expose a portion of first silicon layer 82 and a portion of second silicon layer 92. Thereafter, a nitride or oxide spacer 100 is deposited over exposed sidewalls of second silicon layer 92.

Figure 10:
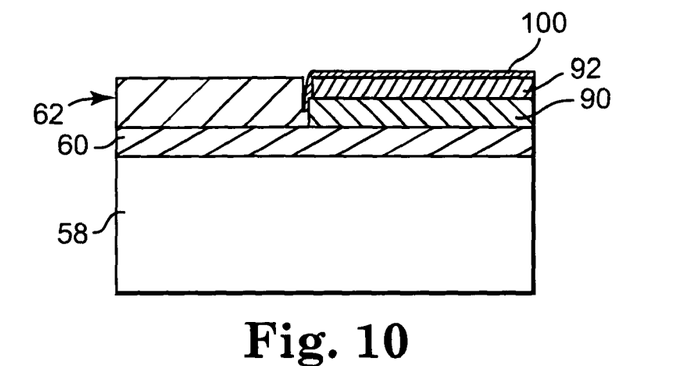
FIG. 10 illustrates an epitaxial crystallization regrowth process applied to the wafer illustrated in FIG. 9 according to one embodiment of the present invention.

FIG. 10 illustrates a cross-sectional view of silicon stratum 62 formed by an epitaxial growth process according to one embodiment of the present invention. The epitaxial growth process is selected to grow semiconductor material that includes strained, metastable, or pseudomorphic materials that are substantially free from defects, i.e., misfits and dislocations. Suitable epitaxial growth processes include, for example, rapid thermal chemical vapor deposition, low-pressure chemical vapor deposition, ultra-high vacuum chemical vapor deposition, atmospheric pressure chemical vapor deposition, molecular beam epitaxy, or plasma-enhanced chemical vapor deposition. Silicon layer 82 (FIGS. 2-9) is grown into stratum 62 until stratum 62 is substantially co-planar with second silicon layer 92. In addition, silicon stratum 62 is grown to maintain the crystal orientation of first silicon layer 82. In one embodiment, silicon stratum 62 includes crystal orientation (100) and second silicon layer 92 is substantially co-planar to silicon stratum 62 and includes crystal orientation (110).

Figure 11:
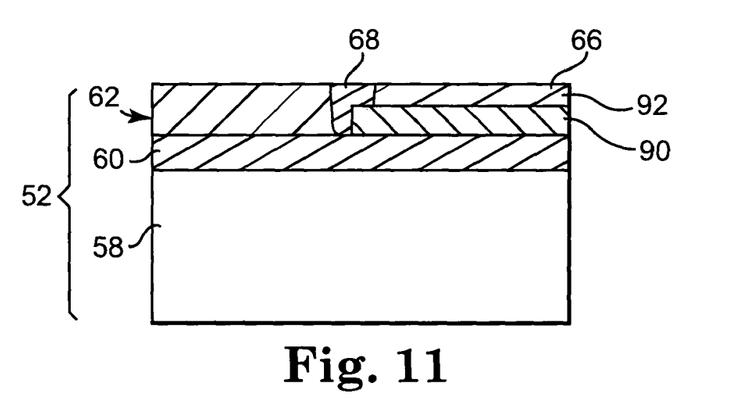
FIG. 11 illustrates a strained SOI device including an isolation trench formed between a semiconductor region having a first crystal orientation and a silicon region substantially co-planar to the semiconductor region and including a crystal orientation different from the first crystal orientation according to one embodiment of the present invention.

FIG. 11 illustrates a strained silicon-on-insulator device 52 after a trench isolation process according to one embodiment of the present invention. Trench 68 is formed to isolate silicon stratum 62 from second silicon layer 92. In one embodiment, trench 68 is formed by a shallow trench isolation process and is filled with electrically insulating material such as, for example, silicon dioxide.

Figure 12:
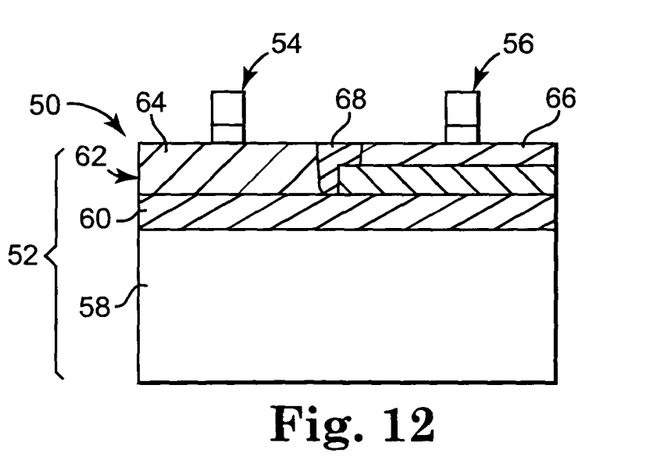
FIG. 12 illustrates a strained silicon-on-insulator chip according to one embodiment of the present invention.

FIG. 12 illustrates a strained SOI chip 50 that according to one embodiment of the present invention is made by the exemplary processes described above. Strained SOI chip 50 includes a strained silicon-on-insulator device 52 including a silicon region 64 having a crystal orientation (100) isolated from silicon region 66 that is substantially co-planar to strained silicon region 64, where silicon region 66 has a crystal orientation (110). In one embodiment, silicon region 66 is a strained silicon region and has a crystal orientation (110). In one embodiment, silicon region 64 is a strained silicon region. First chip component 54 is disposed on strained silicon region 64, and second chip component 56 is disposed on silicon region 66.

Different, but complimentary, strained silicon regions formed on a semiconductor chip have been described. The strained silicon regions can include strained silicon region 64 having a crystal orientation (100) isolated from an optionally strained silicon region 66 having a crystal orientation (110). In this regard, the strained regions include uni-axial tensile strain, a tensile strain, or a compressive strain. In an exemplary embodiment, each of strained silicon region 64 having a crystal orientation (100) and strained silicon region 66 having a crystal orientation (110) is uni-axially tensile strained.

In one embodiment, first chip component 54 is an n-channel transistor (i.e., an nFET) disposed on a compressively strained silicon region 64 and has a crystal orientation (100). To this end, n-channel transistor 54 has increased electron mobility, and increased drive current, as compared to other crystal orientations. In one embodiment, second chip component 56 is a p-channel transistor (i.e., a pFET) disposed on a tensile silicon region 66 having crystal orientation (110), and is thus configured to have increased hole mobility, and increased drive current, as compared to other crystal orientations. Thus, in an exemplary embodiment, both nFET 54 and pFET 56 are SOI-based devices having optimized overall dynamic performance. Strained SOI chip 50 achieves maximum electron and hole mobility and drive currents for its associated transistors based on the preferred and optimal multiple crystal orientations disposed on buried oxide layer 60.

With additional reference to FIGS. 9-10, in one embodiment layer 82 is not silicon, but is rather formed of semiconductor material having a first crystal orientation that defines a lattice mismatch to silicon, such as, for example, germanium. Silicon layer 92 defines a second crystal orientation different that the first crystal orientation of layer 82. In one embodiment, silicon layer 92 is stressed by filloxide 90 via a stress transfer.

A subsequent epitaxial growth of a separate silicon layer on top of layer 82 produces a highly stressed silicon film in the region of stratum 62 (See FIG. 10) via a direct stress transfer from the exemplary germanium layer 82. The subsequent epitaxial growth of separate silicon layer is characterized by a non-relaxed silicon film growth, and is, therefore, highly stressed. In this regard, the epitaxial growth is configured to ensure that few or no dislocation or defects are formed due to the lattice mismatch presented by the germanium, or by another material employed that defines a lattice mismatch to silicon.

FIGS. 13-18 illustrate alternate methods of fabricating a silicon-on-insulator chip having multiple crystal orientations formed from an SOI wafer, according to another embodiment of the present invention.

Figure 13:
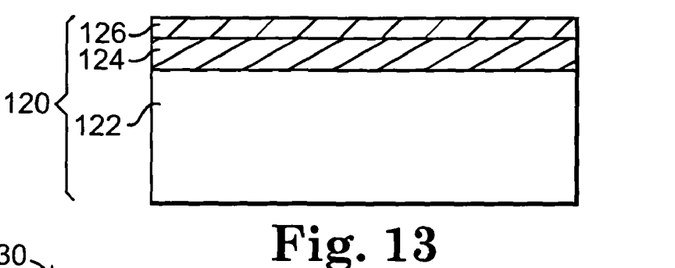
FIG. 13 illustrates a silicon-on-insulator wafer including a semiconductor layer according to one embodiment of the present invention.

FIG. 13 illustrates a cross-sectional view of an SOI wafer 120 including a substrate layer 122 contacting an insulating layer 124 contacting a first silicon layer 126 according to one embodiment of the present invention. First silicon layer 126 is substantially similar to silicon layer 82 (FIG. 2), described above. First silicon layer 126 is, in one embodiment, a crystalline Si-containing semiconductor material deposited to have a thickness ranging from approximately 200 Angstroms to approximately 2000 Angstroms. In one embodiment, first silicon layer 126 is selected to have a crystal orientation of one of (100) or (110) and is bonded to the insulating layer 124.

Figure 14:
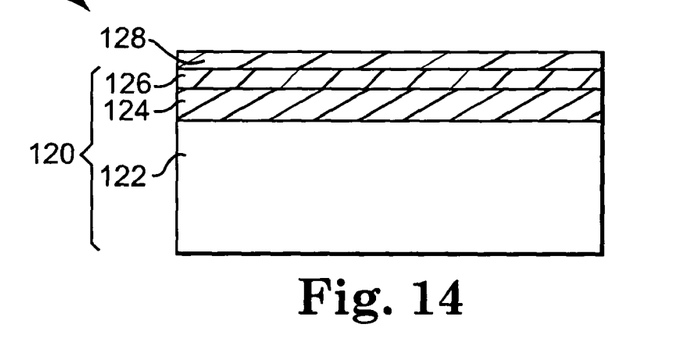
FIG. 14 illustrates a silicon layer disposed on the SOI wafer illustrated in FIG. 13.

FIG. 14 illustrates a cross-sectional view of a wafer stack 130 including a second silicon layer 128 deposited on SOI wafer 120. Second silicon layer 128 is bonded to first silicon layer 126. In one embodiment, second silicon layer 128 defines a crystal orientation different from the crystal orientation of first silicon layer 126. For example, first silicon layer 126 is formed to have a crystal orientation of (100) and second silicon layer 128 is formed to have a crystal orientation of (110).

Figure 15:
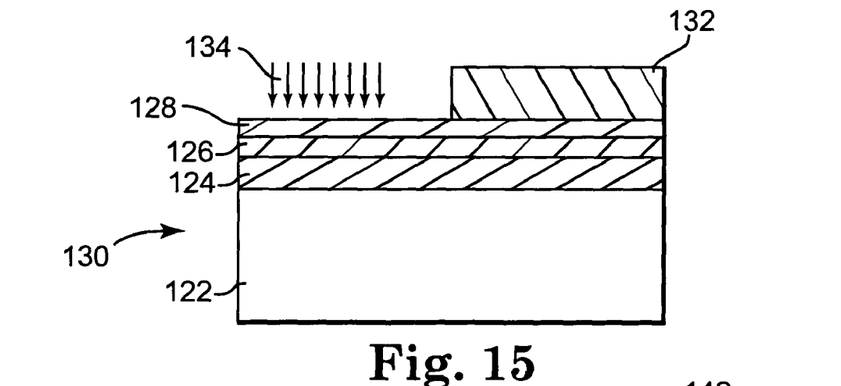
FIG. 15 illustrates an amorphizing ion implantation process applied to the wafer stack illustrated in FIG. 14.

FIG. 15 illustrates a cross-sectional view of an amorphizing ion implant stream 134 incident to a portion of wafer stack 130 according to one embodiment of the present invention. In one embodiment, a photoresist layer 132 is disposed on a portion of second silicon layer 128 and the amorphizing ion implant stream 134 is directed to an exposed portion of second silicon layer 128. The amorphizing ion implant stream 134 forms a structure in an exposed portion of second silicon layer 128 and in first silicon layer 126. For example, in one embodiment the amorphizing ion implant stream 134 amorphizes an entirety of first silicon layer 126 and an exposed portion of second silicon layer 128.

During ion implantation, defects can be created when the incident ions are slowed and fail to transfer completely their momentum to the exposed portion of lattices of second silicon layer 128 and first silicon layer 126. In this case, as slowed ions almost stop, they reach the "end of their range," thus forming an end-of-range (EOR) defect.

In one embodiment, the location of EOR defects is controlled such that the EOR defects reside outside of the exposed portion of second silicon layer 128 and first silicon layer 126. In particular, in one embodiment insulating layer 124 is a buried oxide (BOX) layer and the EOR defects are displaced/located in the BOX layer 124. Thus, a quantity of EOR defects possibly present in the first silicon layer 126 and second silicon layer 128 is decreased, and preferable, minimized.

In one exemplary embodiment, an ion implant stream 134 including ions such as deuterium, helium, oxygen, neon, boron, and/or silicon is applied at approximately room temperature (i.e., 283 K to 303 K) with an ion beam current density ranging from about 0.01 to about 10 microamps/cm$^2$, although other suitable temperatures, ions, and current densities are also acceptable. In this regard, the ion implant conditions are maintained such that the peak of the ion energy range is within (or near) the crystalline silicon layer 126. Thus, EOR defects associated with slow ions become preferentially located in the BOX layer 124.

Figure 16:
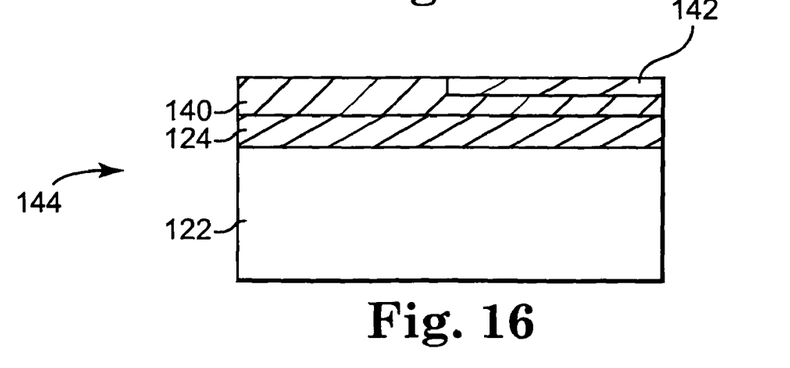
FIG. 16 illustrates a strained silicon-on-insulator device after recrystallization, thermal annealing, and planarization processes have been applied to the wafer stack illustrated in FIG. 15 and according to one embodiment of the present invention.

FIG. 16 illustrates an SOI device 144 after subsequent etch, strip and thermal recrystalization processing of wafer stack 130 according to embodiments of the present invention. FIG. 16 illustrates SOI device 144 after a thermal recrystalization (annealing) process where an epitaxial regrowth of amorphized layers of silicon layers 126, 128 (FIG. 15) has formed silicon layer 140. Silicon layer 140 is a recrystalized silicon layer having a crystal orientation of, for example, (100). Thus, silicon layer 140 includes a recrystallized form of the unmasked portion of second silicon layer 128 and first silicon layer 126, and it includes a crystal orientation of, for example, (100). A masked portion of second silicon layer 128 (FIG. 15) includes a second silicon region 142 having a crystallization orientation of, for example, (110). Thus, two crystal orientations (100) and (110) are present on SOI device 144 and are co-planar and offset parallel from insulating layer 124.

In one embodiment, silicon layer 140 is a strained silicon including a crystal orientation of (100) and second silicon region 142 is a strained silicon including a crystal orientation of (110).

Figure 17:
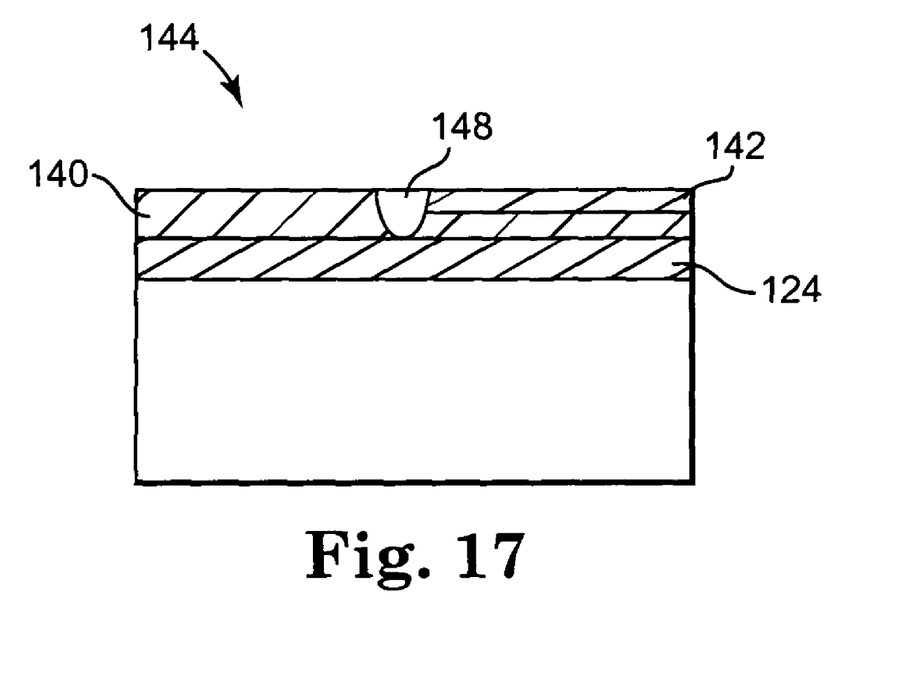
FIG. 17 illustrates a cross-sectional view of an isolation trench separating a semiconductor region having a first crystal orientation from a silicon region disposed substantially co-planar to the semiconductor region and having a crystal orientation different from the first crystal orientation according to one embodiment of the present invention.

FIG. 17 illustrates a cross-sectional view of SOI device 144 after formation of an isolating trench 148 according to one embodiment of the present invention. Trench 148 is substantially similar to trench 68 as described above in FIG. 11. In one embodiment, trench 148 is a shallow isolation trench etched between silicon layer 140 and silicon layer 142 to electrically isolate neighboring components subsequently formed on silicon layer 140 and silicon layer 142. In one embodiment, trench 138 is a shallow trench isolation filled with silicon dioxide.

In another embodiment, the shallow trench is formed prior to the amorphization implant. This prevents lateral epitaxial regrowth during the annealing step.

Figure 18:
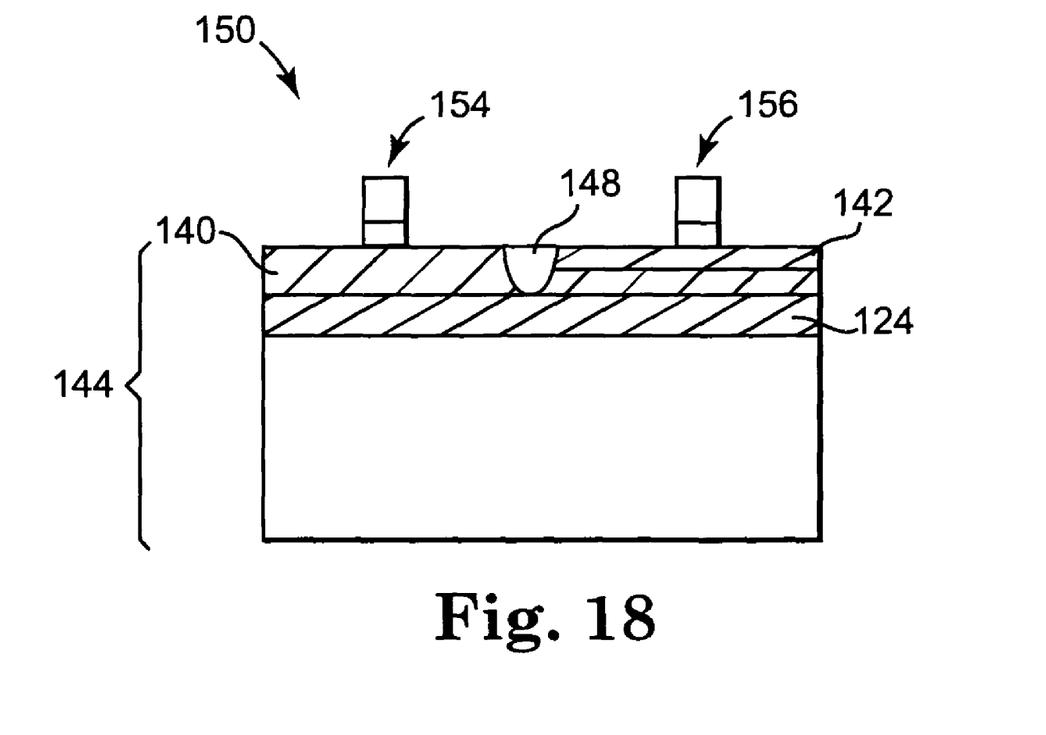
FIG. 18 illustrates a strained silicon-on-insulator chip according to another embodiment of the present invention.

FIG. 18 illustrates a cross-sectional view of a strained SOI chip 150 including chip components 154, 156 according to one embodiment of the present invention. A first chip component 154 is disposed on silicon layer 140 and a second chip component 156 is disposed on second silicon region 142.

Strained SOI chip 150 includes a silicon-on-insulator device 144 including a silicon layer 140 having a crystal orientation (100) isolated from silicon region 142 having a crystal orientation (110). Silicon region 142 is substantially co-planar to silicon layer 140. First chip component 154 is disposed on silicon layer 140, and second chip component 156 is disposed on silicon region 142.

In one embodiment, first chip component 154 is an n-channel transistor (nFET) disposed on silicon layer 140 and defines a crystal orientation (100). To this end, n-channel transistor 54 has increased electron mobility, and increased drive current, as compared to other crystal orientations. In one embodiment, second chip component 56 is a p-channel transistor (pFET) disposed on silicon region 142 and has a crystal orientation (110), and is thus configured to have increased hole mobility, and increased drive current, as compared to other crystal orientations. In this regard, strained SOI chip 150 achieves maximum electron and hole mobility and drive currents for its associated transistors based on the preferred and optimal crystal orientations described above.

A optionally strained SOI chip has been described including an optionally strained silicon-on-insulator device including an optionally strained silicon region having a crystal orientation (100) isolated from a silicon region that is substantially co-planar to the strained silicon-region, where the silicon region has a crystal orientation of (110). Thus, an optionally strained SOI device having both orientations (100) and (110) formed on a buried oxide layer has been disclosed. The strained SOI chip provides a combined nFET and pFET SOI device having maximum electron mobility on a (100) substrate and maximum hole mobility on a (110) substrate.

In addition, an alternate SOI chip and a method of forming the SOI chip have been disclosed. The SOI chip includes a silicon layer having a crystal orientation (100) isolated from a silicon region having a crystal orientation (110), where the silicon region is substantially co-planar to the silicon layer, and end-of-range defects are preferentially located in a buried oxide layer of the SOI chip.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. Thus, this application is intended to cover any adaptations or variations of the specific embodiments discussed herein. Therefore, it is intended that this invention be limited only by the claims and their equivalents.

What is claimed is:

1. A silicon-on-insulator chip comprising:
a substrate layer;
an insulating layer disposed on the substrate layer;
a first compressively strained silicon region having a first crystal orientation and having an underlying first strained layer disposed directly on the insulating layer and which causes the strain of the first strained silicon region; and
a second tensile strained silicon region substantially coplanar with but horizontally offset and isolated from the first strained silicon region with a second crystal orientation different from the first crystal orientation and having an underlying strained filloxide layer disposed directly on the insulating layer which causes the strain of the second strained silicon region;
an n-channel transistor disposed on the first compressively strained silicon region, the n-channel transistor defining a gate dielectric in contact with the first compressively strained silicon region and a gate in contact with the gate dielectric; and
a p-channel transistor disposed on the second tensile strained silicon region, the p-channel transistor defining a separate gate dielectric in contact with the second tensile strained silicon region and a separate gate in contact with the separate gate dielectric.

2. The silicon-on-insulator chip of claim 1, including a shallow trench filled with an insulating material disposed between and isolating the first and second strained silicon regions from one another.

3. The silicon-on-insulator chip of claim 1, wherein the underlying first strained layer comprises a strained silicon layer have the first crystal orientation.

4. The silicon-on-insulator chip of claim 1, wherein the first strained silicon region comprises a crystal orientation of one of (100) and (110), and the second strained silicon region comprises a crystal orientation of the other of (100) and (110).

5. The silicon-on-insulator chip of claim 1, wherein the underlying first strained layer comprises a semiconductor material having the first crystal orientation and which defines a lattice mismatch to silicon.

6. The silicon-on-insulator chip of claim 5, wherein the underlying first strained layer comprises a germanium layer which provides a direct stress transfer to the first compressively strained silicon region.

7. A silicon-on-insulator chip comprising:
a silicon-on-insulator device fabricated on a substrate and including:
a first compressively strained silicon region having a first crystal orientation adjacent to and isolated from a second tensile strained silicon region disposed substantially co-planar to the first compressively strained silicon region and having a second crystal orientation different than the first crystal orientation, the first compressively strained silicon region including an underlying first strained layer disposed directly on an insulating layer of the substrate and which causes the compressive strain of the first compressively strained silicon region, and the second tensile strained silicon region including a underlying strained filloxide layer disposed directly on the insulating layer and which causes the tensile strain in the second tensile strained silicon region;
an n-channel transistor disposed on the first compressively strained silicon region, the n-channel transistor defining a gate dielectric in contact with the first compressively strained silicon region and a gate in contact with the gate dielectric; and
a p-channel transistor disposed on the second tensile strained silicon region, the p-channel transistor defining a separate gate dielectric in contact with the second tensile strained silicon region and a separate gate in contact with the separate gate dielectric.

8. The chip of claim 7, wherein the first compressively strained silicon region comprises a crystal orientation of one of (100) and (110), and the second tensile strained silicon region comprises a crystal orientation of the other of (100) and (110), respectively.

9. The silicon-on-insulator chip of claim 7, wherein the first silicon region and the strained silicon region are each disposed on a single insulating layer that extends continuously over the substrate.

10. The silicon-on-insulator chip of claim 7, wherein the underlying first strained layer comprises a strained silicon layer having the first crystal orientation.

11. The silicon-on-insulator chip of claim 7, wherein the underlying first strained layer comprises a semiconductor material having the first crystal orientation and which defines a lattice mismatch to silicon.

12. The silicon-on-insulator chip of claim 11, wherein the underlying first strained layer comprises a germanium layer which provides a direct stress transfer to the first compressively strained silicon region.

13. The silicon-on-insulator chip of claim 7, wherein the first compressively strained silicon region is electrically isolated from the second tensile strained silicon region by a shallow trench filled with an insulating material.

14. The silicon-on-insulator chip of claim 13, wherein the shallow trench does not extend past the insulating layer of the substrate.

15. The silicon-on-insulator chip of claim 13, wherein the shallow trench communicates with the insulating layer of the substrate.

* * * * *